(12) United States Patent
Jeon

(10) Patent No.: US 7,790,619 B2
(45) Date of Patent: Sep. 7, 2010

(54) METHOD FOR FABRICATING SEMICONDUCTOR DEVICE HAVING NARROW CHANNEL

(75) Inventor: Weon-Chul Jeon, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 115 days.

(21) Appl. No.: 12/001,864

(22) Filed: Dec. 13, 2007

(65) Prior Publication Data

US 2008/0311733 A1     Dec. 18, 2008

(30) Foreign Application Priority Data

Jun. 14, 2007  (KR) .................. 10-2007-0058223

(51) Int. Cl.
*H01L 21/302* (2006.01)
*H01L 21/461* (2006.01)
(52) U.S. Cl. .............................. 438/717; 257/E21.206
(58) Field of Classification Search ................ 438/257, 438/275, 279, 283, 717; 257/270, E21.206
See application file for complete search history.

(56) References Cited

U.S. PATENT DOCUMENTS

| 6,060,346 | A  | * | 5/2000  | Roh et al. ............... 438/200 |
| 6,063,688 | A  | * | 5/2000  | Doyle et al. ............. 438/424 |
| 6,207,503 | B1 | * | 3/2001  | Hsieh et al. ............. 438/263 |
| 6,455,383 | B1 | * | 9/2002  | Wu ........................... 438/296 |
| 6,630,392 | B2 | * | 10/2003 | Kim et al. ................ 438/586 |
| 7,371,669 | B2 | * | 5/2008  | Youn et al. .............. 438/585 |
| 2007/0145469 | A1 | * | 6/2007 | Yoon ......................... 257/316 |
| 2008/0090360 | A1 | * | 4/2008 | Krivokapic .............. 438/283 |

FOREIGN PATENT DOCUMENTS

| KR | 10-2005-0106917 | 11/2005 |
| KR | 10-2006-0068202 | 6/2006 |
| KR | 10-2007-0014407 | 2/2007 |

* cited by examiner

*Primary Examiner*—W. David Coleman
(74) *Attorney, Agent, or Firm*—Blakely, Sokoloff, Taylor & Zafman LLP

(57) ABSTRACT

A method for fabricating a semiconductor device including forming a gate insulation layer, a conductive layer for a gate electrode, and an insulation layer for a gate hard mask over a substrate, selectively etching the insulation layer for a gate hard mask and the conductive layer for a gate electrode to expose a first region of the substrate, thereby forming an initial gate line, forming a first insulation layer for an insulation over a resultant structure where the initial gate line is formed, performing a planarization process until the insulation layer for a gate hard mask is exposed, and selectively etching the insulation layer for a gate hard mask and the conductive layer for a gate electrode to expose a second region of the substrate, the second region being not overlapped with the first region, thereby forming a final gate line having a line width smaller than the initial gate line.

9 Claims, 5 Drawing Sheets

METHOD FOR FABRICATING SEMICONDUCTOR DEVICE HAVING NARROW CHANNEL

CROSS-REFERENCE TO RELATED APPLICATIONS

The present invention claims priority of Korean patent application number 2007-0058223, filed on Jun. 14, 2007, which is incorporated by reference in its entirety.

BACKGROUND OF THE INVENTION

The present invention relates to a method for fabricating a semiconductor device, and more particularly, to a method for fabricating a semiconductor device with a gate line of a fine line width.

As semiconductor devices are highly integrated, a smaller circuit line width is required. The circuit line width is generally determined by a gate line width. Recently, a fine gate line width has been considered very important. In order for insulation between a gate line and a bit line and/or a storage node, an insulation layer forming process and a self aligned contact (SAC) process are performed after forming the gate line. In semiconductor devices having a memory capacity of more than 1 GB, a gate line width of less than 0.1 µm is required for ensuring a process margin in the insulation layer forming process, the SAC process, and so on. On the other hand, the height of the gate line is gradually increased in order to prevent the increase of a gate resistance, which is caused by the reduction of the gate line width.

FIGS. 1A and 1B illustrate a typical method for forming a gate line. Specifically, FIG. 1A is a plan view of a semiconductor device having a gate line, and FIG. 1B is a cross-sectional view taken along a line A-A' of FIG. 1A. Referring to FIGS. 1A and 1B, an isolation layer 12 is formed over a substrate 11 to define an active region 11A. A gate insulation layer 13 is formed over the substrate 11.

A polysilicon layer 14 and a tungsten (W) layer 15 for a gate electrode and a nitride layer 16 for a gate hard mask are sequentially formed over the gate insulation layer 13 and patterned using a mask and an etch processes, thereby forming a gate line 100. Although not shown in FIGS. 1A and 1B, a contact region is formed within the active region 11A on both sides of the gate line 100. The contact region contacts a bit line or a storage node, which will be formed later.

In the process of forming the gate line, the line width of the gate line is being decreased but its height is being increased. Therefore, the gate line may tilt against an adjacent gate line, so that they come in contact with each other, as indicated by dotted lines in FIGS. 1A and 1B. This will cause defects in semiconductor devices.

SUMMARY OF THE INVENTION

Embodiments of the present invention are directed to provide a method for fabricating a semiconductor device with a gate line of a fine line width, which can prevent the tilt of the gate line, whereby the gate line do not come in contact with an adjacent gate line.

In accordance with an aspect of the present invention, there is provided a method for fabricating a semiconductor device. The method includes forming a gate insulation layer, a conductive layer for a gate electrode, and an insulation layer for a gate hard mask over a substrate, selectively etching the insulation layer for a gate hard mask and the conductive layer for a gate electrode to expose a first region of the substrate, thereby forming an initial gate line, forming a first insulation layer for an insulation over a resultant structure where the initial gate line is formed, performing a planarization process until the insulation layer for a gate hard mask is exposed, and selectively etching the insulation layer for a gate hard mask and the conductive layer for a gate electrode to expose a second region of the substrate, the second region being not overlapped with the first region, thereby forming a final gate line having a line width smaller than the initial gate line.

In accordance with another aspect of the present invention, there is provided a method for fabricating a semiconductor device. The method includes forming a gate insulation layer, a conductive layer for a gate electrode, and an insulation layer for a gate hard mask over a substrate, selectively etching the insulation layer for a gate hard mask and the conductive layer for a gate electrode to expose a first region of the substrate, thereby forming an initial gate line, forming a first insulation layer for an insulation over a resultant structure where the initial gate line is formed, and selectively etching the first insulation layer for an insulation, the insulation layer for a gate hard mask and the conductive layer for a gate electrode to expose a second region of the substrate, the second region being not overlapped with the first region, thereby forming a final gate line having a line width smaller than the initial gate line.

DESCRIPTION OF SPECIFIC EMBODIMENTS

Embodiments of the present invention relate to a method for fabricating a semiconductor device with a gate line of a fine line width.

Figure 1A:
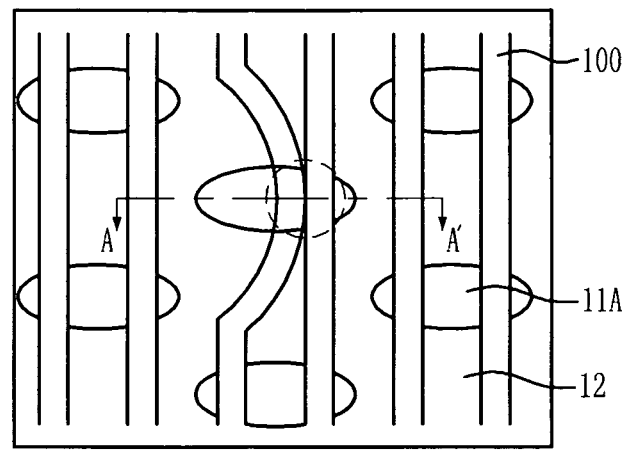
FIGS. 1A and 1B illustrate a typical method for forming a gate line.
Figure 1B:
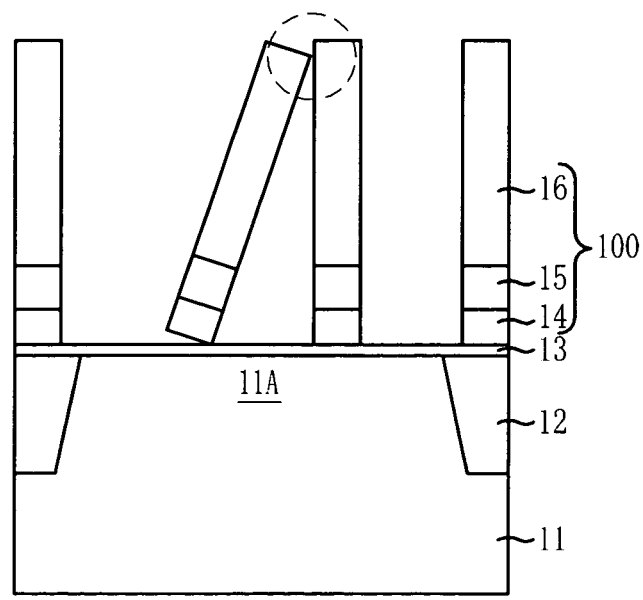
Figure 2A:
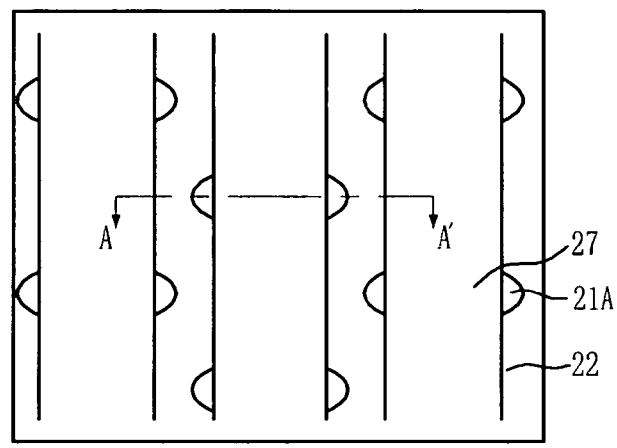
FIGS. 2A to 4 illustrate a method for fabricating a semiconductor device in accordance with a first embodiment of the present invention.
Figure 2B:
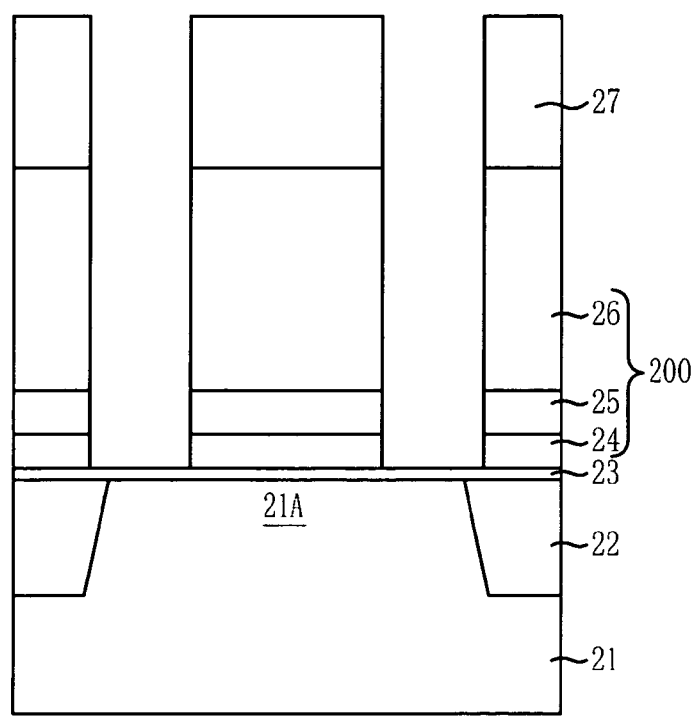
Figure 3A:
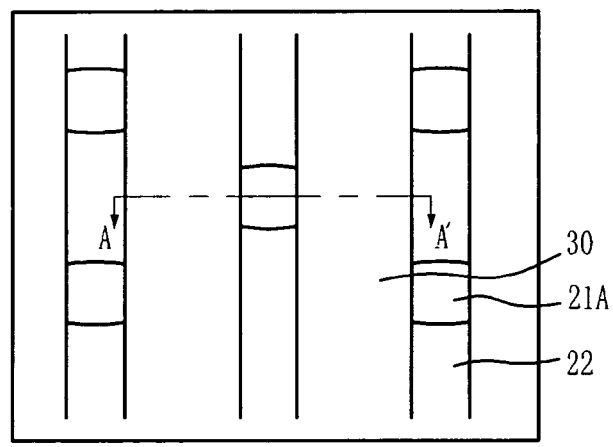
Figure 3B:
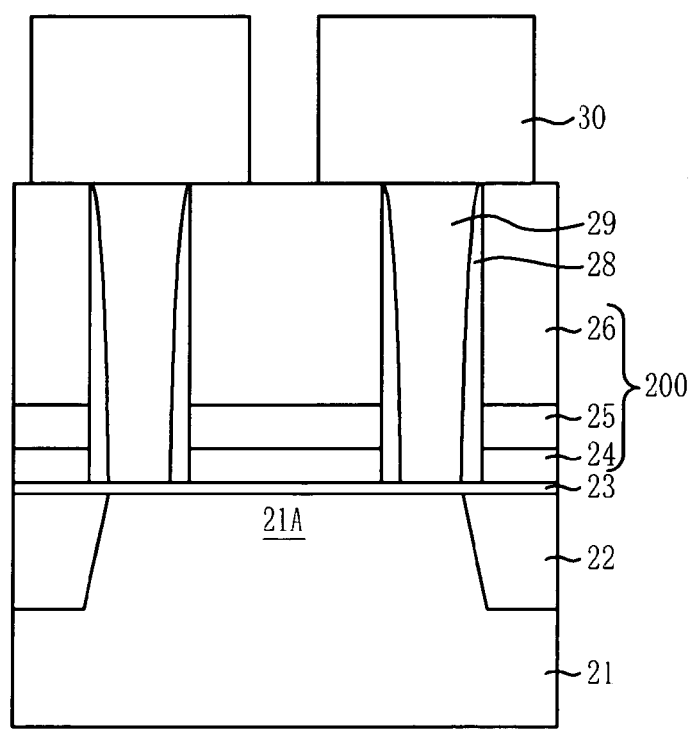

In FIGS. 2A to 3B, FIGS. 2A and 3A are plan views of the method for fabricating the semiconductor device, and FIGS. 2B and 3B are cross-sectional views taken along a line A-A' of FIGS. 2A and 3A, respectively.

FIGS. 2A to 4 illustrate a method for fabricating a semiconductor device in accordance with a first embodiment of the present invention.

Referring to FIGS. 2A and 2B, an isolation layer 22 is formed over a substrate 21 to define an active region 21A. A gate insulation layer 23 is formed over the substrate 21.

A polysilicon layer 24 for a gate electrode and a tungsten layer 25 for a gate electrode and an insulation layer 26 for a gate hard mask are sequentially formed over the gate insulation layer 23. Herein, a nitride layer can be used as the insulation layer 26. First photoresist patterns 27 for a gate patterning are formed over the nitride layer 26 for the gate hard mask. At this point, the first photoresist patterns 27 are formed to expose a portion of the substrate 21, where a storage node will be contacted. This portion will be referred to as a storage node contact region.

The nitride layer 26 for the gate hard mask, and the W layer 25 and the polysilicon layer 24 for the gate electrode are sequentially etched using the first photoresist patterns 27 as an etch mask, thereby forming initial gate lines 200 exposing the storage node contact region.

Referring to FIGS. 3A and 3B, the first photoresist patterns 27 are removed. A nitride layer is deposited over a resultant structure. A blanket etch process is performed on the nitride layer to form first nitride layers 28 for gate spacers on both sidewalls of each of the initial gate lines 200.

A first oxide layer 29 for an insulation is formed over a resultant structure. A planarization process such as a chemical mechanical polishing (CMP) process or an etch-back process is performed until the nitride layer 26 for a gate hard mask is exposed.

A second photoresist pattern 30 for a gate patterning is formed over the planarized structure. At this point, the second photoresist pattern 30 is formed to expose a portion of the substrate 21, where a bit line will be contacted.

Figure 4:
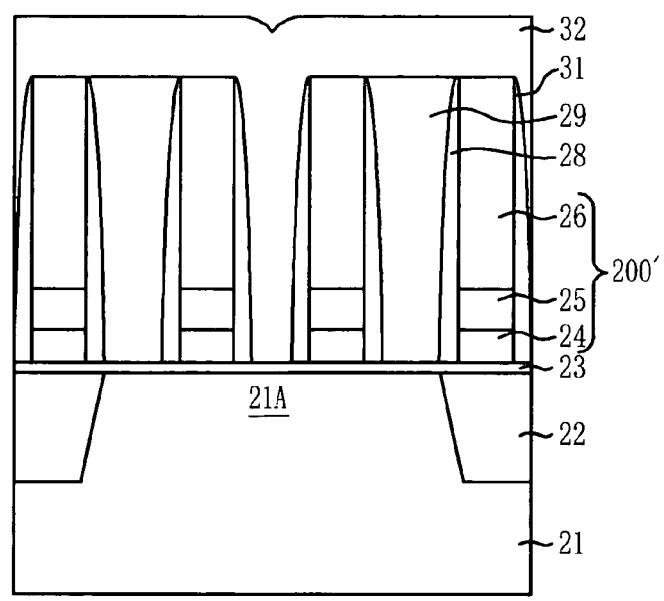

Referring to FIG. 4, the nitride layer 26 for the gate hard mask, and the W layer 25 and the polysilicon layer 24 for the gate electrode are sequentially etched using the second photoresist pattern 30 as an etch barrier, thereby forming final gate lines 200'. It can be seen that a width of the final gate line 200' is significantly reduced compared with the initial gate line 200.

A second nitride layer 31 for gate spacers are formed on exposed sidewalls of the final gate line 200', and a second oxide layer 32 for an insulation is formed over a resultant structure. Although not shown, a planarization process such as a CMP process or an etch-back process is performed until the nitride layer 26 for the gate hard mask is exposed.

Consequently, gate spacers including the first and the second nitride layers 28 and 31 are formed on both sidewalls of the final gate line 200' having a fine line width. An insulation layer including the first and second oxide layers 29 and 32 are formed over the substrate 21 between the final gate lines 200'. The gate lines can be formed with a fine line width, without tilting, by alternately performing the etch process of forming the gate lines and the process of forming the insulation layer filling the gap between the gate lines, which have been described above with reference to FIGS. 2 to 4.

Figure 5:
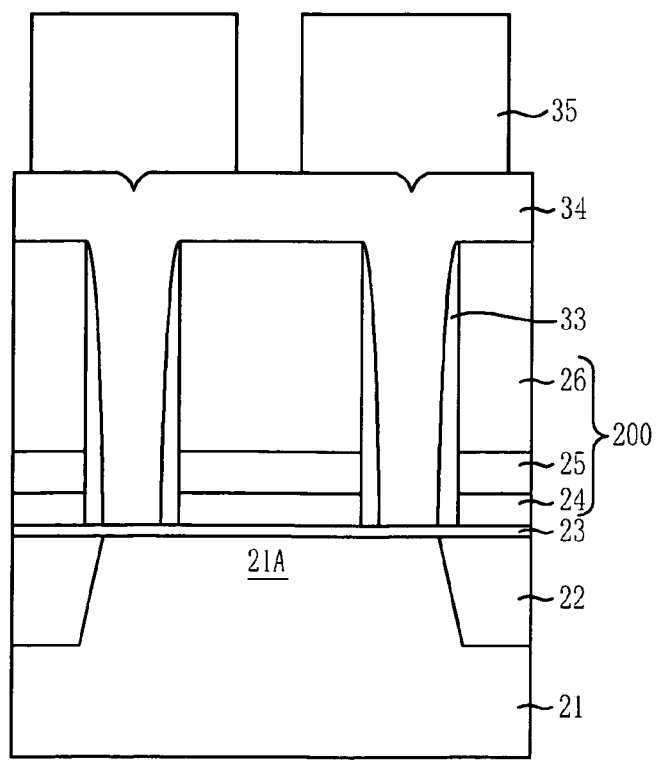
FIGS. 5 and 6 illustrate a method for fabricating a semiconductor device in accordance with a second embodiment of the present invention.
Figure 6:
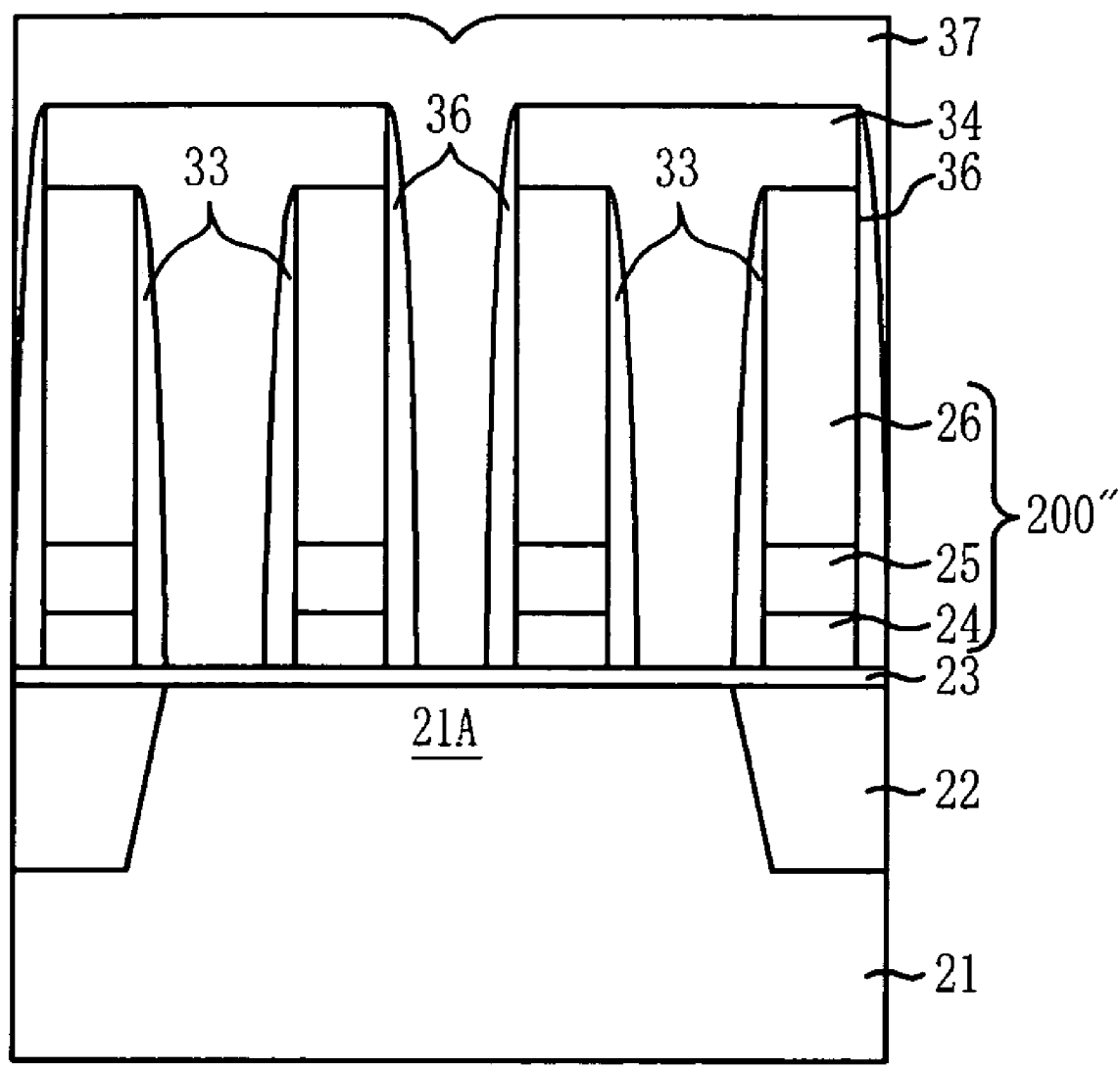

FIGS. 5 and 6 illustrate a method for fabricating a semiconductor device in accordance with a second embodiment of the present invention. In accordance with the second embodiment of the present invention, the processes of FIGS. 5 and 6 are performed after the processes of FIGS. 2A and 2B. Therefore, the description about the processes of FIGS. 2A and 2B will be omitted and the same reference numerals are used to refer to the same elements.

Referring to FIG. 5, after the initial gate line 200 is formed over the substrate 21 by the processes of FIGS. 2A and 2B the first photoresist pattern is removed (see FIGS. 2A and 2B). A first nitride layer 33 for gate spacers is formed on both sidewalls of the initial gate line 200. A first oxide layer 34 for an insulation is formed over a resultant structure to cover the initial gate line 200.

A second photoresist pattern 35 for a gate patterning is formed over the first oxide layer 34 for the insulation. At this point, the second photoresist pattern 35 is formed to expose a portion of the substrate 21, where a bit line will be contacted. This portion will be referred to as a bit line contact region.

Referring to FIG. 6, the first oxide layer 34 for the insulation, the nitride layer 26 for the gate hard mask, and the W layer 25 and the polysilicon layer 24 for the gate electrode are sequentially etched using the second photoresist pattern 35 as an etch barrier, thereby forming a final gate line 200". It can be seen that a width of the final gate line 200" is significantly reduced compared with the initial gate line 200.

A second nitride layer 36 for gate spacers is formed on exposed sidewalls of the etched first oxide layer 34 and the final gate line 200", and a second oxide layer 37 for an insulation is formed over a resultant structure. Although not shown, a planarization process such as a CMP process or an etch-back process is performed until the nitride layer 26 for a gate hard mask is exposed.

Consequently, gate spacers including the first and the second nitride layers 33 and 36 are formed on both sidewalls of the final gate line 200" having a fine line width. An insulation layer including the first and the second oxide layers 34 and 37 are formed over the substrate 21 between the final gate lines 200".

In accordance with the embodiments of the present invention, the tilt of the gate lines can be prevented, so that the gate lines do not come in contact with each other.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device, the method comprising:
    forming a gate insulation layer, a conductive layer for a gate electrode, and an insulation layer for a gate hard mask over a substrate;
    selectively etching the insulation layer for the gate hard mask and the conductive layer for the gate electrode to expose a first region of the substrate, thereby forming an initial gate line;
    forming a first insulation layer over a resultant structure where the initial gate line is formed;
    performing a planarization process until the insulation layer for the gate hard mask is exposed;
    forming a photoresist pattern after performing the planarization process; and
    selectively etching the insulation layer for the gate hard mask and the conductive layer for the gate electrode by using the photoresist pattern to expose a second region of the substrate, the second region being not overlapped with the first region, thereby forming a final gate line having a line width smaller than the initial gate line.

2. The method of claim 1, wherein the first region is a storage node contact region and the second region is a bit line contact region.

3. The method of claim 1, wherein the conductive layer for the gate electrode has a stacked structure of a polysilicon layer and a tungsten layer.

4. The method of claim 1, further comprising, after the forming of the initial gate line, forming a first nitride layer for a gate spacer on both sidewalls of the initial gate line.

5. The method of claim 1, further comprising, after the forming of the final gate line, forming a second insulation layer over a resultant structure.

6. The method of claim 1, wherein the planarization process comprises a chemical mechanical polishing (CMP) process and an etch-back process.

7. The method of claim 4, further comprising, after the forming of the final gate line, forming a second nitride layer for the gate spacer on the exposed sidewalls of the final gate line.

8. The method of claim 7, wherein the first nitride layer for the gate spacer and the second nitride layer for the gate spacer comprise a nitride layer.

9. The method of claim 5, wherein the first insulation layer and the second insulation layer comprise an oxide layer.

* * * * *